United States Patent
Ho et al.

(10) Patent No.: US 9,344,005 B2
(45) Date of Patent: May 17, 2016

(54) METHOD AND APPARATUS FOR PRODUCING THREE-PHASE CURRENT

(71) Applicant: ABB Research Ltd, Zürich (CH)

(72) Inventors: Ngai-Man Ho, Fislisbach (CH); Gerardo Escobar, Merida (MX); Francisco Canales, Baden-Dättwil (CH)

(73) Assignee: ABB RESEARCH LTD., Zürich (CH)

( * ) Notice: Subject to any disclaimer, the term of this patent is extended or adjusted under 35 U.S.C. 154(b) by 48 days.

(21) Appl. No.: 14/186,259

(22) Filed: Feb. 21, 2014

(65) Prior Publication Data

US 2014/0241016 A1 Aug. 28, 2014

(30) Foreign Application Priority Data

Feb. 22, 2013 (EP) .................................... 13156384

(51) Int. Cl.
| | |
|---|---|
| H02M 7/06 | (2006.01) |
| H02M 7/49 | (2007.01) |
| H02M 3/335 | (2006.01) |
| H03B 1/00 | (2006.01) |
| H02M 7/493 | (2007.01) |
| H02M 7/487 | (2007.01) |

(52) U.S. Cl.
CPC ................ *H02M 7/49* (2013.01); *H02M 3/335* (2013.01); *H02M 7/493* (2013.01); *H03B 1/00* (2013.01); *H02M 7/487* (2013.01)

(58) Field of Classification Search
CPC ....................................................... H02M 7/537
USPC ........................ 363/40, 123, 131, 37, 43, 132
See application file for complete search history.

(56) References Cited

U.S. PATENT DOCUMENTS

| | | |
|---|---|---|
| 4,670,828 A | 6/1987 | Shekhawat et al. |
| 7,126,409 B2 | 10/2006 | Nielsen |

(Continued)

FOREIGN PATENT DOCUMENTS

WO WO 2009/073582 A2 6/2009

OTHER PUBLICATIONS

European Search Report mailed on Jun. 17, 2013 for European Application No. 13156384.
Benjamin Sahan et al., Comparative Evaluation of Three-Phase Current Source Inverters for Grid Interfacing of Distributed and Renewable Energy Systems, IEEE Transactions on Power Electronics, vol. 26, No. 8, Aug. 2011, pp. 2304-2318.

(Continued)

*Primary Examiner* — Jeffrey Gblende
*Assistant Examiner* — Trinh Dang
(74) *Attorney, Agent, or Firm* — Buchanan Ingersoll & Rooney PC (57) ABSTRACT

Exemplary embodiments are directed to methods and systems for producing a three-phase current to a three-phase output. Switching converters are used to generate a positive current, a negative current, and an intermediate current. The system is configured such that the produced positive current follows a path of a highest phase of a sinusoidal three-phase signal at a given time, the produced negative current follows a path of a lowest phase of the three-phase signal at the given time, and the produced intermediate current follows a path of a phase of the three-phase signal between the highest and the lowest phase at the given time. The produced currents are switched to each phase conductor of the three-phase output in sequence so that phase currents of the three-phase current are formed in the output conductors.

8 Claims, 8 Drawing Sheets

(56) References Cited

U.S. PATENT DOCUMENTS

| | | |
|---|---|---|
| 2009/0003024 A1 | 1/2009 | Knaup |
| 2009/0244936 A1 | 10/2009 | Falk et al. |
| 2010/0080030 A1* | 4/2010 | Wiegman et al. ............. 363/131 |
| 2012/0236615 A1* | 9/2012 | Kitabatake .................... 363/131 |
| 2013/0119763 A1* | 5/2013 | Zhu et al. ........................ 307/43 |
| 2014/0112040 A1* | 4/2014 | White ........................... 363/123 |

OTHER PUBLICATIONS

R Naik et al., A Novel Grid Interface, Optimized for Utility-Scale Applications of Photovoltaic, Wind-Electric, and Fuel-Cell Systems, IEEE Transactions on Power Delivery Oct. 10, 1995, No. 4, New York, US, pp. 1920-1926.

Bruno Burger et al., Extreme High Efficiency PV-Power Converters, Proc. EPE09, Sep. 2009, pp. 1-13.

* cited by examiner

Prior Art

Figure 1

Prior Art

Figure 2a

Prior Art

Figure 2b

Prior Art

Figure 2c

Prior Art

Figure 3a

Prior Art

METHOD AND APPARATUS FOR PRODUCING THREE-PHASE CURRENT

RELATED APPLICATION

This application claims priority under 35 U.S.C. §119 to European Patent Application No. 13156384.3 filed in Europe on Feb. 22, 2013, the content of which is hereby incorporated by reference in its entirety.

FIELD

The present disclosure relates to three-phase voltage source inverters, and more particularly to converting a DC voltage into three-phase currents by using a multi-level-current concept.

BACKGROUND INFORMATION

Plants generating renewable energy can be considered key components in the next generation of power systems, such as smart grids and microgrids. As discussed in the document by B. Burger and D. Kranzer titled "Extreme High Efficiency PV-Power Converter," in Proc. EPE09, September 2009, these plants can also provide an alternate power source to known energy sources, such as oil, coal and natural gas.

A known characteristic for a renewable energy generating process is that an inverter is used in the process as an interface transforming available renewable energy in the form of a DC voltage to an AC voltage. Thus, DC/AC inverter technology can have a role in generating renewable energy in high power three-phase grid-connected applications.

DC/AC inverting technology can be implemented in various ways. The DC/AC inverting technology can have multiple degrees of freedom, for example, with respect to circuit topology, semiconductors, storage and filtering passive devices. These aspects can be interrelated, that is, changing one aspect can affect another. An effect of a change can manifest itself as an advantage or a drawback. Different combinations of different aspects can be used for serving different purposes.

A known approach for inverting a DC voltage into a three-phase AC voltage is to use a voltage source inverter (VSI), as renewable energy sources can be seen as DC voltage sources. If a DC voltage source can provide a sufficiently high voltage, only one power stage can be enough for the DC/AC conversion.

Figure 1:
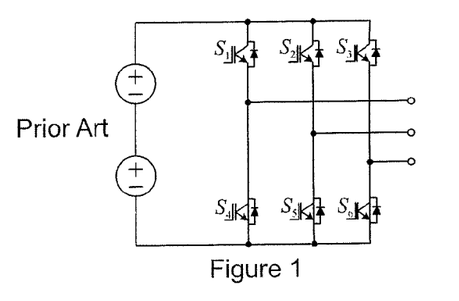
FIG. 1 shows a two-level voltage source inverter with six switches according to a known implementation.

FIG. 1 shows a known two-level voltage source inverter with six switches $S_1$ to $S_6$. An advantage of this inverter topology is a smaller component count compared with some other topologies. However, the six switches $S_1$ to $S_6$ can have to be high-frequency semiconductors, and their breakdown characteristics should be such that the switches are able to handle the full DC link voltage. Because of high switching losses on the semiconductors, the known two-level voltage source inverter topology cannot always be suitable for applications with high switching frequency.

Figure 2A:
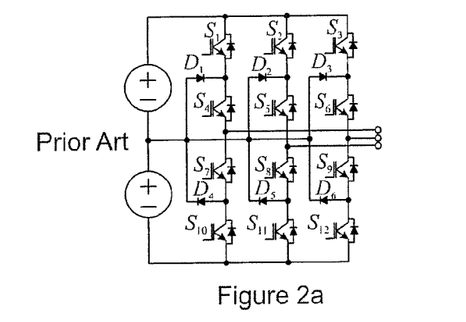
FIGS. 2a to 2c show known three-level voltage source inverter topologies according to a known implementations.
Figure 2B:
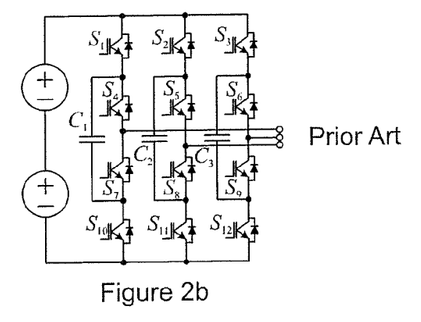
Figure 2C:
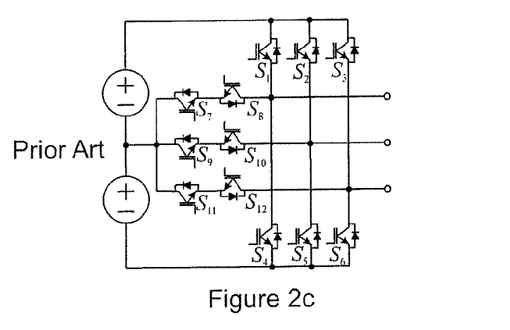

As discussed in U.S. Pat. No. 4,670,828, multi-level voltage source inverters were proposed to tackle the high switching losses of the two-level voltage source inverters. Output inductors of multi-level VSIs can be subjected to smaller transients, as the output voltage/current can be formed in smaller steps. This allows the use of output inductors with smaller inductances. Smaller inductances allow considerable reductions in size and losses of the inductors. FIGS. 2a to 2c show known three-level voltage source inverter topologies which have been adopted in industry and discussed in U.S. Pat. No. 7,126,409 B2, U.S. Patent Application Publication No. US 2009/0244936 A1, and U.S. Patent Application Publication No. US 2009/0003024 A1.

FIG. 2a illustrates a neutral-point-champed (NPC) voltage source inverter topology. In three-level topology, three inverter legs are implemented by using twelve switches $S_1$ to $S_{12}$. The inverter legs are clamped to the neutral point through diodes $D_1$ to $D_6$. Breakdown voltages of all semiconductors $S_1$ to $S_{12}$ and $D_1$ to $D_6$ are half of the DC link voltage. Thus, the switching losses of the semiconductors can be lower than those of a two-level voltage source inverter. Further, fast semiconductors can be utilized in the outer switches $S_1$ to $S_3$ and $S_{10}$ to $S_{12}$ and NPC diodes $D_1$ to $D_6$. Size and losses of the output inductors can be reduced by increasing the switching frequency. A drawback of this topology is that the inner slower switching switches $S_4$ to $S_9$ have relatively high conduction losses.

FIG. 2b illustrates a flying capacitor (FC) voltage source inverter topology. The three-level topology includes fewer semiconductors than the inverter NPC topology of FIG. 2a. Instead of clamping diodes, three flying capacitors $C_1$ to $C_3$ are used. In comparison with the topology of FIG. 2a, all semiconductors have to be rated capable of fast switching, and, thus, overall switching losses can become higher than those of the NPC topology. Moreover, control complexity of the topology can also be higher, as controlling the voltages of the flying capacitors $C_1$ to $C_3$ can also be specified.

FIG. 2c illustrates a T-type NPC voltage source inverter topology. A three-level output is achieved by using a half bridge including six switches $S_1$ to $S_6$ in combination with active clamping. In FIG. 2c, the active clamping is implemented by using switches $S_7$ to $S_{12}$. In comparison with the NPC topology of FIG. 2a, the slow switches $S_7$ to $S_{12}$ in FIG. 2c have fewer conduction losses. On the other hand, the faster switching switches $S_1$ to $S_6$ in FIG. 2c should be able to tolerate full DC voltage, which can increase their switching losses.

Wide-band-gap (WBG) semiconductors, such as Gallium Nitride (GaN) and Silicon Carbide (SiC), can be used to reduce the switching losses of these switches. The WBG semiconductors can be, however, more expensive than pure Silicon (Si) devices. The topology of FIG. 2c would have six expensive WBG switches, which can be seen as a drawback to the topology.

Figure 3A:
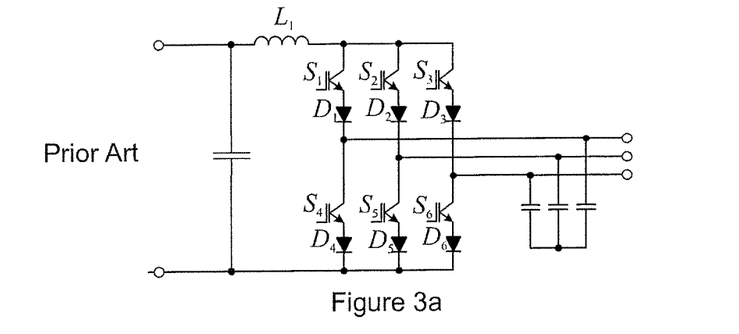
FIGS. 3a and 3b illustrate current source inverter topologies according to a known implementations.
Figure 3B:
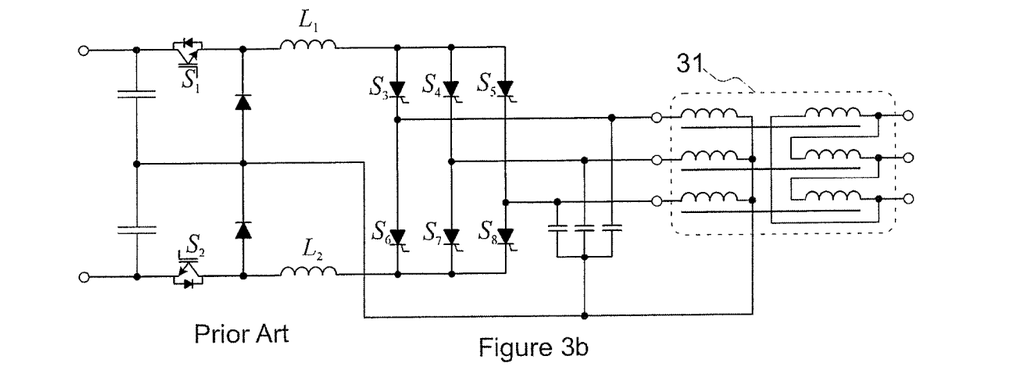

Another approach for converting a DC voltage to a three-phase AC voltage is by means of a current source inverter (CSI). FIGS. 3a and 3b illustrate some current source inverter topologies.

FIG. 3a shows a known current source inverter topology as discussed in the document of B. Sahan, S. Araujo, C. Nöding, and P. Zacharias titled "Comparative Evaluation of Three-Phase Current Source Inverters for grid interfacing of distributed and renewable energy systems," IEEE Trans. Power Electron., vol. 26, no. 8, 2304-2318, August 2011. The topology shares a drawback with the two-level VSI topology in FIG. 2a. That is, six pairs of fast and high-breakdown-voltage switches $S_1$ to $S_6$ and diodes $D_1$ to $D_6$ can be used in FIG. 3a. The semiconductor losses can be high, and a current through a DC link inductor $L_1$ circulates all the time which can lead to high power losses in the DC link inductor $L_1$.

FIG. 3b illustrates an indirect current source inverter (ICSI) topology introduced in the document of R. Raik, N. Mohan, M. Rogers, and A. Bulawka titled "A noval grid interface optimized for utility-scale applications of photovoltaic, wind-electric, and fuel-cell systems," IEEE Trans. Power Del., vol. 10, no. 4, pp. 1920-1926, October 1995, and discussed in WO 2009073582 A2. The topology uses two fast switches $S_1$ and $S_2$ for shaping the current of inductors $L_1$ and $L_2$, and six slow switches $S_3$ to $S_8$ to reform the currents. A lossy and bulky three-phase transformer 31 is used to convert them to inphase currents. Total Harmonic Distortion (THD) of the output current can be very poor.

SUMMARY

An exempalry apparatus for producing a three-phase current is disclosed, comprising: a three-phase output; a DC voltage input including a positive terminal, a negative terminal, and a neutral terminal; a first switching converter connected between the positive terminal and the neutral terminal; a second switching converter connected between the neutral terminal and the negative terminal; a third switching converter including an inverter leg connected between the positive terminal and the negative terminal, and an output having an inductor connected thereto; a two-level three-phase inverter bridge including three parallel-connected inverter legs between outputs of the first switching converter and second switching converter, wherein outputs of the inverter legs can be connected to phase conductors of the three-phase output; and an arrangement of bidirectional switching devices connected between the third switching converter output and each of the phase conductors.

An exemplary method is disclosed for producing a three-phase current by using an apparatus that includes a three-phase output, and a DC voltage input having a positive terminal, a negative terminal, and a neutral terminal, the method comprising: producing a positive current via a first buck converter connected between the positive terminal and the neutral terminal, wherein the produced positive current follows a path of a highest phase of a sinusoidal three-phase signal at a given time; producing a negative current via a second buck converter connected between the neutral terminal and the negative terminal, wherein the produced negative current follows a path of a lowest phase of the three-phase signal at the given time; producing an intermediate current via a third switching converter that includes an inverter leg connected between the positive terminal and the negative terminal, and an inductor at the output of the third switching converter, wherein the produced intermediate current follows a path of a phase of the three-phase signal between the highest and the lowest phase at the given time; and switching the produced currents to each phase conductor of the three-phase output in sequence so that phase currents of the three-phase current are formed in the output conductors.

BRIEF DESCRIPTION OF THE DRAWINGS

In the following the disclosure will be described in greater detail by means of exemplary embodiments with reference to the attached drawings, in which.

DETAILED DESCRIPTION

Exemplary embodiments of the present disclosure provide a method and an apparatus for implementing the method so as to alleviate the above disadvantages.

An exemplary embodiment of the present disclosure discloses a method and an apparatus implementing the method, which can be used to convert DC voltage to a three-phase AC voltage/current. The disclosed method and inverter can be used, for example, for providing a sinusoidal, in-phase three-phase output current to a three-phase power network.

The exemplary method implements a multi-level-current concept for forming three-phase currents. In order to form three sinusoidal output phase currents, an inverter implementing the disclosed method can comprise three routes for current: a positive, a negative and a middle route.

A positive current through the positive route can follow the highest phase of a sinusoidal three-phase reference at a given time, a negative current through the negative route can follow the lowest phase of the reference, and an intermediate current through the middle route can follow a phase current between the highest and the lowest phase.

Sinusoidal output phase currents at a three-phase output can then be constructed by supplying the three phase conductors of the output with the positive, the negative, and the intermediate current in sequence.

Each route can include high-frequency semiconductors for shaping the current waveform, and low-frequency semiconductors for distributing the shaped currents to the output phase conductors.

When the produced output three-phase current is sinusoidal and in phase with the output/load voltage, the positive route and the negative route together carry a large majority of the supplied power. The positive and negative currents can both be produced by using one switching device, and, therefore, the disclosed inverter topology can be implemented by using only two fast switching devices with a high current rating. As the middle route carries only a small portion of the total power, the current shaping part of the middle route can be implemented with switching devices having lower current ratings. The semiconductors distributing the shaped currents can be low-frequency components.

The disclosed method and inverter topology can be implemented cost-efficiently by using only a few high current, high switching frequency switching devices. The disclosed method and inverter topology can also provide a higher power density, as the core size of the output inductors can be reduced by increasing the switching frequency. The inverter can be connected to the three-phase grid directly, without a transformer. This further reduces the overall size and cost of the system. Also, there can be no high frequency ground leakage currents flowing through the DC voltage source terminals and the grounded frame.

An exemplary embodiment of the present disclosure is directed to a method for producing a three-phase current. The method can be used to produce the three-phase current from a DC voltage which can be generated by a renewable energy source, for example. An apparatus implementing the disclosed method can be used, for example, to convert the DC voltage produced by a solar power plant or by a wind power generator into a three-phase, in-phase sinusoidal current at a three-phase output of the inverter.

The output can be connected to a three-phase AC power grid or load, for example.

The exemplary method includes producing a positive current, a negative current, and an intermediate current.

Phases forming a sinusoidal three-phase signal can have one highest phase, one lowest phase, and one intermediate phase, e.g., a phase between the highest and the lowest phase, at a given time, at least if the moments when values of the phases can be crossing each other can be disregarded.

Thus, the produced positive current of the disclosed method can follow the path of the highest phase of a (balanced) sinusoidal three-phase signal at a given time and the produced negative current can follow a path of the lowest phase of the three-phase signal at the given time. The produced intermediate current can follow a path of a phase of the three-phase signal which is between the highest and the lowest phase at the given time.

Figure 4A:
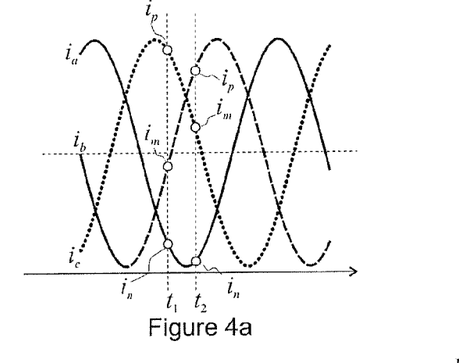
FIGS. 4a and 4b show an example of generating a positive current, a negative current, and an intermediate current according to an exemplary embodiment of the disclosure.
Figure 4B:
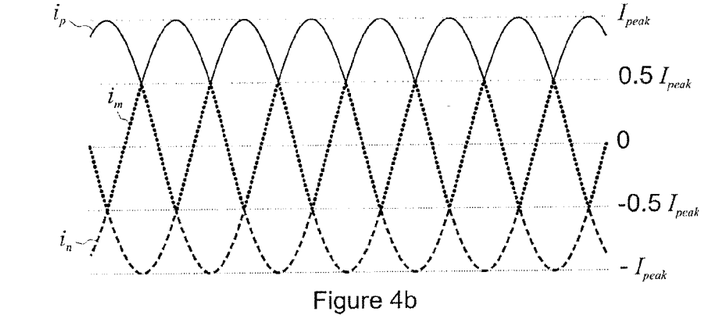

FIGS. 4a and 4b show an example of generating the positive current $i_p$, the negative current $i_n$, and the intermediate current $i_m$.

In FIG. 4a, three phase currents $i_a$ to $i_c$ of a current reference $i_{abc}$ form an exemplary three-phase signal.

At the time $t_1$, the positive current $i_p$ has the value of the phase current $i_c$. The intermediate current $i_m$ follows the path of the phase current $i_b$, and the negative current $i_n$ follows the path of the phase current $i_a$.

At the time $t_2$, the value of the positive current $i_p$ follows the phase current $i_b$, and the intermediate current $i_m$ follows the phase current $i_c$. The negative current $i_n$ still follows the phase current $i_a$.

FIG. 4b shows an exemplary path to be followed by the positive current $i_p$. The path alternates between the positive peak $I_{peak}$ the reference current and the of half value of the positive peak $I_{peak}$. In FIG. 4b, the negative current $i_n$ alternates between the reference current negative peak $-I_{peak}$ and its half value. The produced positive current $i_p$ and the produced negative current $i_n$ follow paths of half-wave-rectified sinusoidal three-phase signals. In FIG. 4b, the intermediate current $i_m$ alternates between the half values of the positive peak $I_{peak}$ and the negative peak $-I_{peak}$. Thus, the produced intermediate current $i_m$ follows a path which resembles a triangular wave signal which oscillates at a frequency twice the frequency of the positive current $i_p$ and the negative current $i_n$. The disclosed method can then switch the produced currents to each phase conductor of the three-phase output in sequence so that phase currents of the three-phase output current can be formed.

Switching converters can be used for generating the positive, the negative, and the intermediate current. For example, the positive current $i_p$ can be produced from a DC voltage by using a first switching converter. In a similar manner, the negative current $i_n$ can be produced by using a second switching converter, and the intermediate current $i_m$ by using a third switching converter.

FIG. 4b illustrates ideal waveforms of the produced currents $i_p$, $i_n$, and $i_m$. However, when the produced currents can be generated by switching converters, they can not exactly correspond with their references phases but follow the phases of the reference within a tolerance range.

Figure 5:
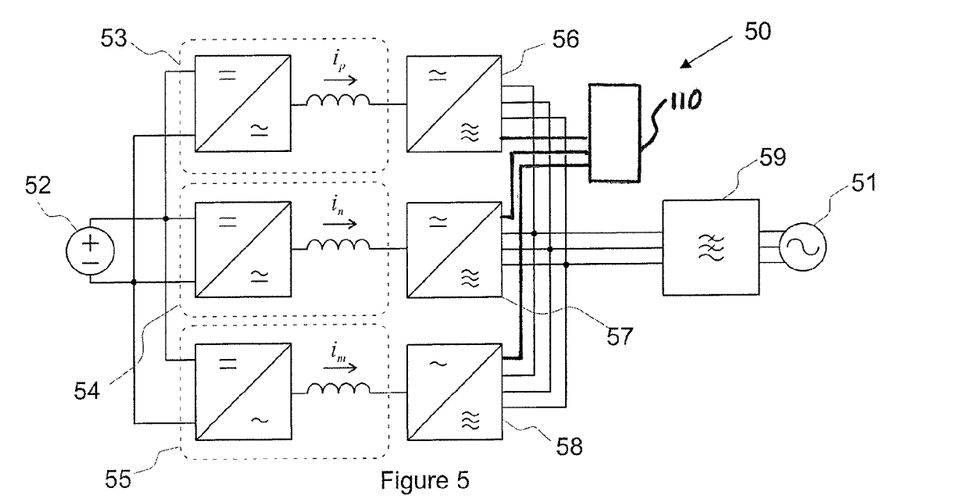
FIG. 5 is a simplified block diagram of an apparatus for producing a three-phase current according to an exemplary embodiment of the disclosure.

FIG. 5 is a simplified block diagram of an apparatus implementing the disclosed method for producing a three-phase current. Some potential applications for the apparatus of FIG. 5 can be grid-connected inverters for solar, wind, fuel cell energy sources and uninterruptible power supply energy systems.

In FIG. 5, the apparatus 50 includes a three-phase output including three phase conductors a, b, and c. In FIG. 5, the three-phase output is connected to a power network 51. Alternatively, the output can be connected to a three-phase load.

The apparatus in FIG. 5 also includes a DC voltage input which is connected to a DC voltage source 52. The DC voltage source 52 can be a renewable energy source, such as a solar power generator or a wind power generator.

The apparatus 50 forms three routes for current from the DC voltage input to the three-phase output. Thus, the apparatus 50 includes a first switching converter 53, a second switching converter 54, a third switching converter 55 and current distributing means 56 to 58. The first switching converter 53 and first current distributing means 56 connected to the output of the first converter 53 form the first route. In a similar manner, the second switching converter 54 and second current distributing means 57 connected to the output of the second converter 54 form the second route. The third switching converter 55 and third current distributing means 58 connected to the output of the third converter 55 form the third route. The apparatus 50 can also include an EMI filter 59 for filtering the produced three-phase output current.

In FIG. 5, the first switching converter 53 is configured to produce a positive current $i_p$ following a path of the highest phase of a sinusoidal three-phase signal. The first switching converter 53 supplies the produced positive current $i_p$ to a first switching converter output.

In FIG. 5, the three-phase signal can be a balanced sinusoidal three-phase current reference, for example, which is generated on the basis of the fundamental, e.g., first, harmonic of the voltage of the power network 51 and the power supplied to the DC voltage input by the DC voltage sources 52. The path to be followed can then be determined for the positive current by comparing the present values of the current reference with each other and using the largest value as the reference.

The second switching converter 54 is configured to produce a negative current $i_n$ which follows a path of the lowest phase of the three-phase signal. The second switching 54 converter supplies the produced negative $i_n$ current to a second switching converter output. The path to be followed by the negative current can be determined using the lowest present phase value of the three-phase current reference.

The third switching converter 55 is configured to produce an intermediate current $i_m$ which follows a path of a phase of the three-phase signal between the highest phase current and the lowest phase current at a given time t. In other words, the one phase left after picking the highest and the lowest phase can be used as the path to be followed for the intermediate current $i_m$. The third switching converter 55 supplies the produced intermediate $i_m$ current to a third switching converter output.

In FIG. 5, the first switching converter 53, the second switching converter 54 and the third switching converter 55 can be supplied through the DC voltage input. However, the switching converters can also be powered by separate and/or different power supplies.

The positive current $i_p$, the negative current $i_n$, and the intermediate current $i_m$ can then be used for generating phase currents to phase conductors a, b, and c of the three-phase output. The outputs of the switching converters 53 to 55 provide different partial current shapes of a sinusoidal phase current. These partial shapes can be assembled into sinusoidal phase current waveforms. In FIG. 5, this is accomplished by the current distributing means 56 to 58. The current distributing means 56 to 58 can be capable of switching each of the switching converter 53, 54, and 55 outputs to any phase conductor a, b or c of the three-phase output.

In order to form phase currents of the three output phase current in the output conductors a, b, and c, the apparatus 50 can include control means, such as a controller 110, for controlling the current distributing means 56 to 58 to connect the switching converter outputs to each output phase conductor a, b, and c in sequence.

Figure 6:
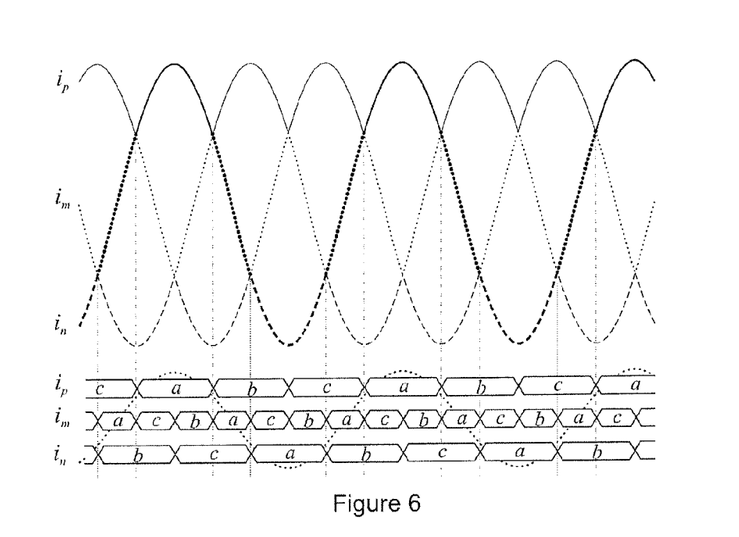
FIG. 6 illustrates an exemplary formation of phase currents according to an exemplary embodiment of the disclosure.

FIG. 6 illustrates an exemplary formation of phase currents for the apparatus of FIG. 5. Current distributing means connect the first switching converter 53 output producing the positive current $i_p$ to one of the phase conductors a, b or c at a time, in sequence as shown in FIG. 6. The second switching converter 54 output producing the negative current $i_n$ and the third switching converter output 55 producing an intermediate current $i_m$ can be both also connected to the phase conductors a, b, and c in sequence. All three switching converters 53 to 55 can be connected to different phases. As an example, the produced current of the phase a is highlighted in FIG. 6.

The switching converters 53 to 56 can include high-frequency semiconductors in order to shape the DC voltage into a desired form. However, the current distributing means 56 to 58 can be adapted to operate at a lower switching frequency than the corresponding switching converters 53 to 56. FIG. 6 shows that the current distributing means operate at a relatively low switching frequency: the first and second switching converter outputs can be switched to a certain phase once per cycle of the three-phase output current, and the third converter output is connected to a same phase twice per cycle. Assuming that the three-phase output current is in phase with the output voltage, the first route and the second route producing the positive current and the negative current carry together a large majority of power transferred between the DC voltage input and the three-phase output. For example, in case of a sinusoidal balanced three-phase current which is in phase with the grid voltage, 92% of power can go through the first and the second routes. The third route can then carry 8% of the power. As the third route producing the intermediate current $i_m$ carries only a small portion of the total power, the third route can be implemented by using switching devices with lower current ratings than the components of the first route and the second route. Thus, the apparatus 50 can be implemented by using high-frequency, high-power components only in the first second switching converter and the second switching converter.

The exemplary method and topology can also provide a high power density, as increasing the switching frequency allows the use of smaller output inductors. The exemplary apparatus can be used for connecting a DC voltage source to a three-phase grid directly without a transformer.

If the input DC voltage is lower than the peak of the phase-to-line voltage, a boost converter can be used for increasing the input voltage of the apparatus. All routes can be connected to the boost converter output in order to simplify the control scheme of the apparatus or, alternatively, the third route generating the intermediate current can be connected to the input of the boost converter in order to reduce the handling power of the boost converter and the losses of the third route.

Figure 7:
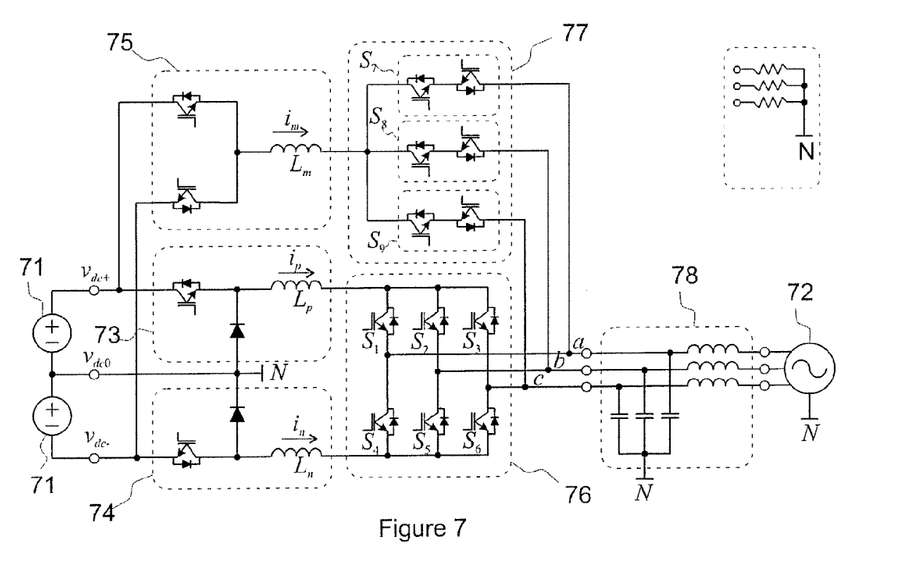
FIG. 7 illustrates an exemplary apparatus producing a three-phase current from a DC voltage according to an exemplary embodiment of the disclosure.

FIG. 7 illustrates an exemplary apparatus producing a three-phase current from a DC voltage. In FIG. 7, the apparatus 70 includes a DC voltage input and an output including three phase conductors a, b, and c. The DC voltage input is connected to DC voltage sources 71 through a positive input terminal $v_{dc+}$, negative input terminal $v_{dc-}$ and neutral input terminal $v_{dc0}$. In FIG. 7, the voltage sources 71 can, for example, be split capacitors supplied by solar panel arrays. According to another exemplary embodiment of the present disclosure, the voltage sources 71 can be batteries, fuel cells, pure DC voltage sources or other sources providing DC voltage.

In FIG. 7, the phase conductors a, b, and c of the three-phase output can be connected to a three-phase grid 72 so that the apparatus 70 can be used for supplying power generated by the solar panel arrays 71 to the grid 72.

In FIG. 7, the apparatus 70 further includes a first switching converter 73, a second switching converter 74, a third switching converter 75, and current distributing means 76 and 77 for switching each of the switching converter outputs to any output phase conductor a, b, or c of the three-phase output. The apparatus 70 also includes an EMI filter 78 at its output.

The first switching converter 73 and the second switching converter 74 can be supplied through the DC voltage input. The first switching converter 73 in FIG. 7 can be implemented as a first buck converter, for example, which is connected between the positive input terminal $v_{dc+}$, and the neutral input terminal $v_{dc0}$. In FIG. 7, the first buck converter includes a series-connection of a switching device and an inductor between the positive input terminal $v_{dc+}$ and the output of the first buck converter. A diode is connected between the neutral input terminal $v_{dc0}$ and the interconnection between the switching device and the inductor.

The second switching converter 74 in FIG. 7 is implemented as a second buck which is connected between the neutral terminal $v_{dc0}$ and the negative terminal $v_{dc-}$. In FIG. 7, the second buck converter includes a series-connection of a switching device and an inductor between the negative input terminal $v_{dc-}$ and the output of the second buck converter. A diode is connected between the interconnection between the switching device and the inductor and the neutral input terminal $v_{dc0}$.

Together, the first switching converter 73 and the second switching converter 74 form a symmetric high-frequency switching buck converter.

In FIG. 7, the symmetric high-frequency switching buck converter is used to shape the supplied DC voltage into two current wave forms. The first switching converter 73 is supplied from the positive input terminal $v_{dc+}$ and the neutral input terminal $v_{dc0}$ and produces a positive current $i_p$ through its output inductor $L_p$. The positive current $i_p$ follows a path of the highest phase of a three-phase signal at a given time, where the three-phase signal is in the form of a sinusoidal three-phase current reference.

A basis for the current reference can be formed by calculating the fundamental harmonic of the grid 72 voltage. The current reference can follow the sinusoidal waveform of the fundamental harmonic with the same frequency and phase. The amplitude of the current reference can then be modified by a Maximum Power Point Tracker (MPPT), for example, which controls the extraction of power from the solar power arrays 71.

The second switching converter 74 is supplied from the neutral terminal $v_{dc0}$ and the negative terminal $v_{dc-}$ and produces a negative current $i_n$ through its output inductor $L_n$. The produced negative current $i_n$ follows the lowest phase current of the current reference at the given time.

In FIG. 7, a two-level three-phase inverter bridge acts as the current distributing means 76 for the first switching converter 73 and the second switching converter 74. The inverter bridge 76 includes three parallel-connected inverter legs between the outputs of the first switching converter 73 and the second switching converter 74. Each leg includes an upper switching device ($S_1$, $S_2$, and $S_3$) and a lower switching device ($S_4$, $S_6$, and $S_6$). In FIG. 7, the switches $S_1$ to $S_6$ can be coupled with antiparallel diodes. Outputs of the inverter bridge 76 legs can be connected to the phase conductors of the three-phase output. The switches $S_1$ to $S_3$ can be capable of connecting the first switching converter 73 output to the phase conductors a, b, and c. In a similar manner, the switches $S_4$ to $S_6$ can be capable of connecting the second switching converter 74 output to the phase conductors a, b, and c. In other words, the inverter bridge 76 is capable of allocating the produced positive current $i_p$ and negative current $i_n$ to correct output phase conductor phases a, b, or c.

In FIG. 7, the third switching converter 75 includes a two-level inverter leg connected between the positive terminal $v_{dc+}$ and the negative terminal $v_{dc-}$ of the DC voltage input. The third switching converter 75 further includes an inductor $L_m$ at its output. The third switching converter 75, being supplied from the positive terminal $v_{dc+}$ and the negative terminal $v_{dc-}$ of the DC voltage input, produces an intermediate current $i_m$ which follows a phase current of the current reference between the highest and the lowest phase current at the given time.

An arrangement of bidirectional switching devices $S_7$ to $S_9$ connected between the third switching converter output and each of the phase conductors acts as the current distributing means 77 for the third switching converter 75. The bidirectional switches $S_7$ to $S_9$ can be capable of connecting the third switching converter 75 output to the phase conductors a, b, and c, making the arrangement 77 capable of allocating the produced intermediate current $i_m$ to the correct output phase conductor.

The apparatus 70 further includes control means for controlling the current distributing means 76 and 77. The current distributing means 76 and 77 in FIG. 7 can be controlled by the control means, such as a controller, to connect the switching converter outputs to each output phase conductor a, b, and c in sequence so that the phase currents of the three phase current can be formed in the output conductors a, b, and c. In other words, the inverter bridge 76 and the arrangement 77 of bidirectional switches can be controlled such that they allocate the produced currents $i_p$, $i_n$, and $i_m$ to the correct phases a, b, and c.

Figure 8:
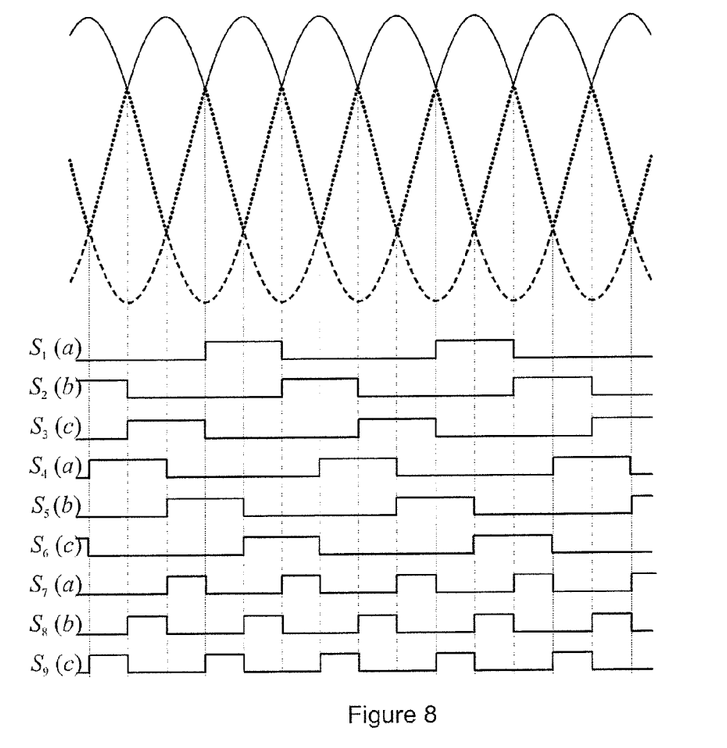
FIG. 8 illustrates exemplary gate signals according to an exemplary embodiment of the disclosure.

FIG. 8 illustrates exemplary gate signals for the switches $S_1$ to $S_6$ of the inverter bridge 77 and the bidirectional switching devices $S_7$ to $S_9$ of the arrangement 77 in FIG. 7. A high level of a gate signal indicates that the corresponding switch is in the conducting state.

FIG. 8 shows that the switching converters can be connected to one phase at a time, and all switching converters can be connected to different phases. For example, the first switching converter output is connected to the output phases a, b, and c in a repeating cycle. FIG. 8 also shows that only one of the switches capable of connecting the switching converter outputs to a certain phase conductor, for example phase a, is active at a time.

The apparatus 70 in FIG. 7 includes three routes for current. A first route is formed by the first switching converter 73 and upper switches $S_1$, $S_2$, and $S_3$ of the inverter bridge 76. A second route is formed by the second switching converter 74 and lower switches $S_4$, $S_5$, and $S_6$ of the inverter bridge 76. A third route is formed by a third switching converter 75 and the arrangement 77 of bidirectional switching devices $S_7$ to $S_9$.

If the produced three-phase current can be assumed to be sinusoidal and in phase with the grid 72 voltage, the semiconductors in the third route can be rated to withstand only a fraction of the rated power of the semiconductor components in the first and second routes.

At the same time, the current distributing means 76 and 77 can be adapted to operate at a lower switching frequency than the switching converters 73 to 75.

The switches in the first switching converter 73, the second switching converter 74, and the third switching converter 75 can be MOSFETs, IGBTs, JFETs or BJTs, for example. As in FIG. 7, the switches can be coupled with antiparallel diodes handling reverse current flow.

The bidirectional switches $S_7$ to $S_9$ and the switches $S_1$ to $S_6$ in the inverter bridge 76 can be IGBTs, thyristors or GTOs, for example.

The apparatus 70 can provide a high efficiency as it can be implemented by using only two fast switching devices with a high current rating. The apparatus of FIG. 7 can also cost-efficiently reduce losses by using next-generation semiconductors, such as SiC and GaN semiconductors, as the fast, high-power switches.

According to another exemplary embodiments, the implementations of the switching converters 73 to 75 and the current distribution means 76 and 77 can be expanded from the exemplary embodiments shown in FIG. 7. For example, there can be several topology options for implementing the third route. In order to reduce the breakdown voltage and the losses of the semiconductors, multi-level inverter topologies can be applied, as shown in FIGS. 9a and 9b.

Figure 9A:
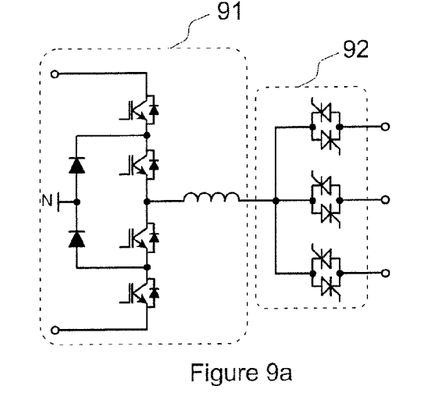
FIGS. 9a and 9b illustrate some applicable multi-level inverter topologies according to an exemplary embodiment of the disclosure.

FIG. 9a illustrates an exemplary implementation of the third route, where a third switching converter 91 is implemented by using a NPC inverter leg, and current distributing means 92 for the third switching converter 91 can be implemented by using two antiparallel silicon-controlled rectifiers (SCR).

Figure 9B:
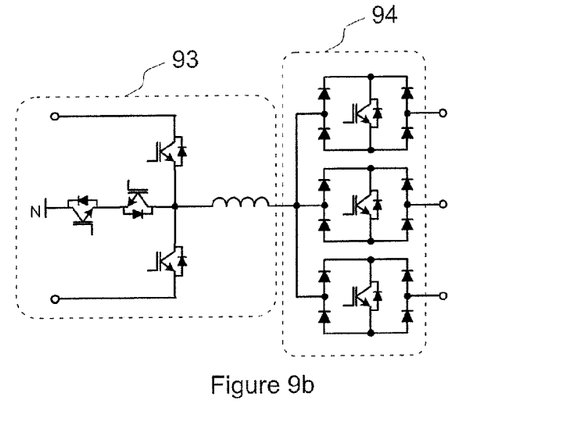

FIG. 9b illustrates another exemplary implementation of the third route, where a third switching converter 93 is implemented by using a T-type NPC inverter leg, and current distributing means 94 for the third switching converter 93 can be implemented by using a Vienna-type bi-directional single switch configuration.

Alternatively, other topologies, such as a flying capacitor topology can be used for the third route. The first and second routes can also be implemented in various alternative ways.

In some cases, such as in solar panel applications, the DC source voltage can not always be sufficient for guaranteeing proper operation of the switching converters of the disclosed apparatus. Thus, a DC-DC boost converter can be used between the DC source and the switching converters shaping the current.

Figure 10A:
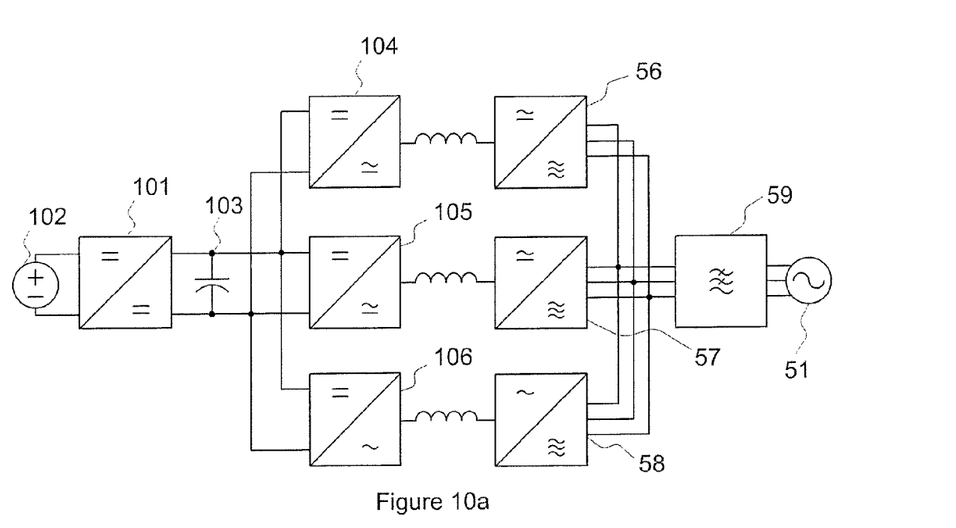
FIGS. 10a and 10b illustrate block diagrams of apparatuses in which boost converters can be used according to an exemplary embodiment of the disclosure.

FIG. 10a illustrates an exemplary block diagram where a boost converter 101 is used. The boost converter is located between the solar panel 102 and a DC link 103. A first switching converter 104, a second switching converter 105 and a third switching converter can be connected to the poles of the DC link 103.

Figure 10B:
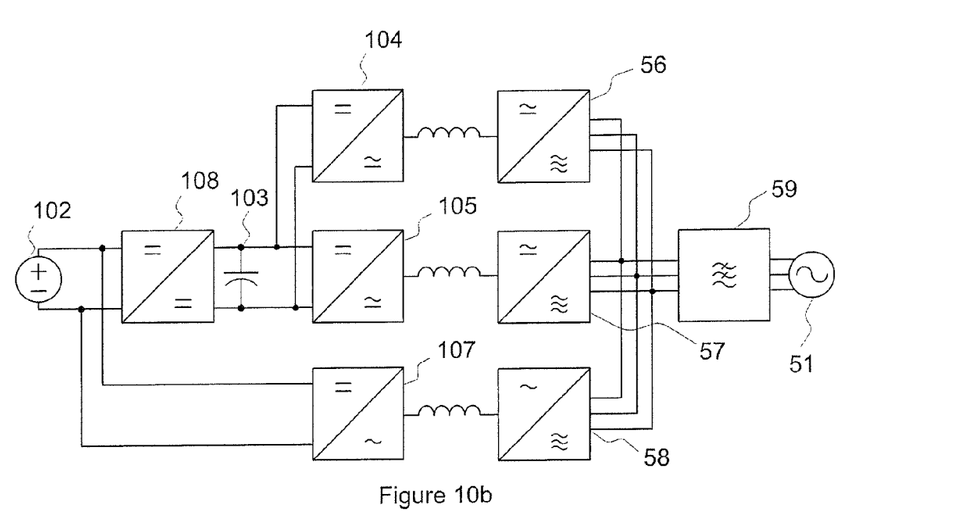

FIG. 10b illustrates another approach for using a boost converter in the input of the disclosed apparatus. As generating the intermediate current can specify less DC voltage reserve, a third switching converter 107 producing the intermediate current can be connected directly to the DC voltage source, as illustrated in FIG. 10b. This can reduce power through the boost converter 108 and, thus, also the switching losses in the third route. On the other hand, the control scheme of FIG. 10b can be more complex than in FIG. 10a.

The operation of an arrangement as illustrated in FIG. 7 was simulated in order to verify its operation. In the simulation, the input source consisted of two pure 350-V DC voltage sources arranged in series. Thus, the input voltage was 700 V. The output was a three-phase four-wire grid network with an RMS voltage of 380 V. The simulated output power of the inverter was 4 kW. All semiconductors and inductors were considered ideal components in the simulation.

The results show that the disclosed apparatus can guarantee a sinusoidal output current.

Figure 11A:
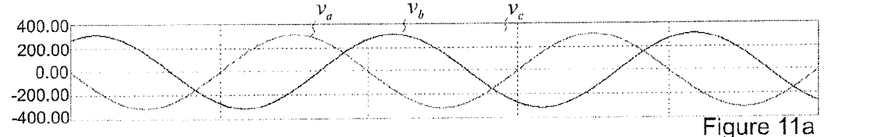
FIGS. 11a to 11d illustrate simulated waveforms according to an exemplary embodiment of the disclosure.

FIGS. 11a to 11d illustrate simulated waveforms. FIG. 11a shows the three-phase grid voltages $v_a$ to $v_c$.

Figure 11B:
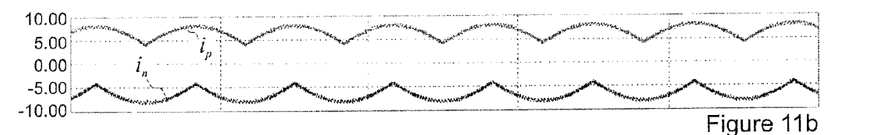

FIG. 11b shows the positive current $i_p$ generated by the first switching converter 73 and the negative current $i_n$ generated by the second switching converter 74. Both currents carry a 150 Hz AC ripple. As the produced currents can be generated by the switching converters, they also contain a small ripple at the switching frequencies of the switching converters 73 and 74.

Figure 11C:
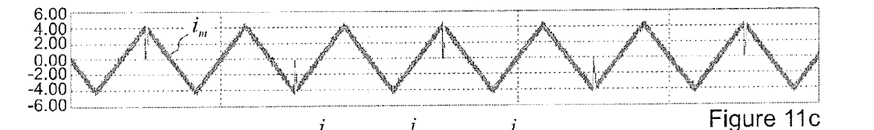
Figure 11D:
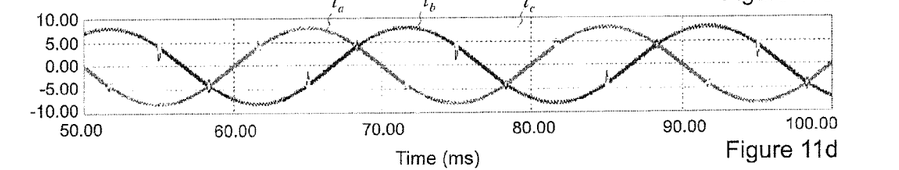

FIG. 11c shows the intermediate current $i_m$ generated by the third switching converter 75. The intermediate current $i_m$ has almost a triangular waveform. FIG. 11d shows the output phase currents $i_a$ to $i_c$ constructed out of the produced currents $i_p$, $i_n$, and $i_m$ by using the inverter bridge 76 and the arrangement 77 of bidirectional switches. The produced output phase currents $i_a$ to $i_c$ can be in phase with the corresponding phase voltages $v_a$ to $v_c$ of the grid 72.

FIGS. 12a to 12d illustrate simulated waveforms related to phase a of the three-phase output.

Figure 12A:
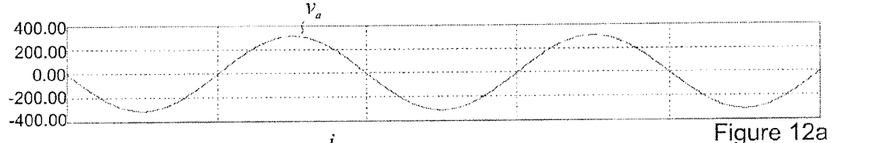
FIGS. 12a to 12d illustrate simulated waveforms related to one phase of a three-phase output according to an exemplary embodiment of the disclosure.

FIG. 12a shows the phase voltage $v_a$ of the grid voltage.

Figure 12B:
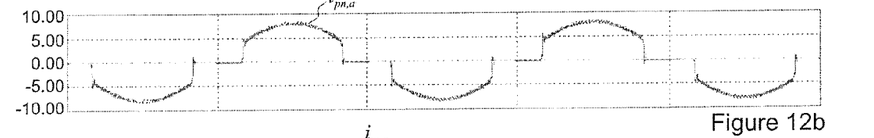

FIG. 12b shows a first partial output current $i_{pn,a}$ constructed by the inverter bridge 76 for the phase a. In the manner illustrated in FIG. 8, the first partial output current $i_{pn,a}$ is constructed by sequentially supplying the output phase conductor a with the produced positive current $i_p$ and the negative current $i_n$.

Figure 12C:
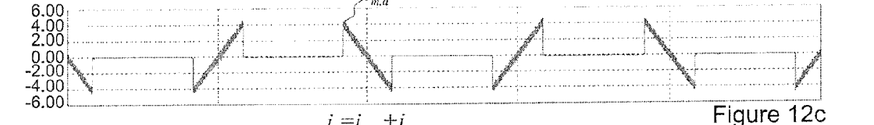

FIG. 12c shows a second partial output current $i_{m,a}$ for the phase a, constructed by the arrangement 77 of bidirectional switches. The second partial output current $i_{m,a}$ is constructed by sequentially supplying the output phase a with the produced intermediate current $i_m$.

Figure 12D:
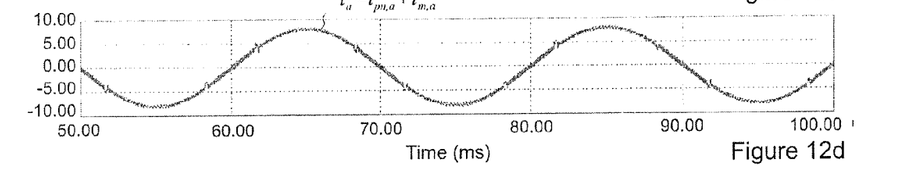

FIG. 12d shows the resulting phase output current $i_a$. As shown in FIGS. 12b and 12d, the first partial output current $i_{pn,a}$ and second partial current $i_{m,a}$ can be connected to the phase conductor a in an interleaved manner such that the resulting phase output current $i_a$ has a sinusoidal shape.

FIGS. 13a to 13f show gate signals of the switching converters and the current distributing means with respect to the phase a of the three-phase output.

Figure 13A:
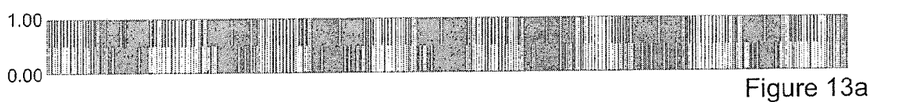
FIGS. 13a to 13f show gate signals of switching converters and current distributing means with respect to one phase of a three-phase output according to an exemplary embodiment of the disclosure.
Figure 13B:
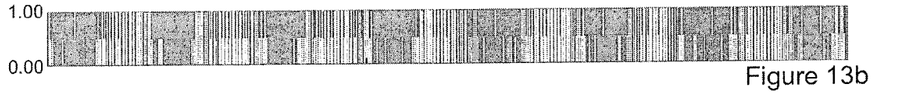
Figure 13C:
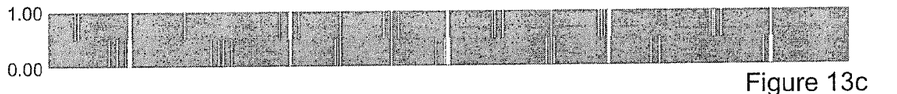

FIGS. 13a to 13c illustrate the gate signals of the first switching converter 73, the second switching converter 74, and the third switching converter 75, respectively. FIG. 13c shows only the high-frequency high-side gate signal of the inverter leg in the third switching converter 75. The low-side gate signal has the opposite waveform.

Figure 13D:
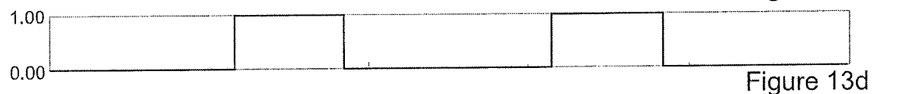
Figure 13E:
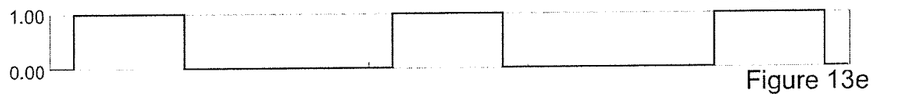
Figure 13F:
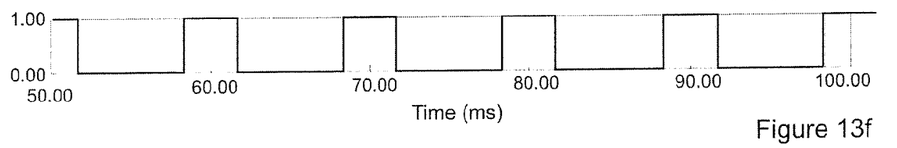

FIGS. 13d and 13e show the gate signals for a leg of the inverter bridge 76 controlling phase a. The switching frequency is at 50 Hz. FIG. 13f shows the gate signal for the phase a in the arrangement 77 of bidirectional switches. The gate signal operates at a switching frequency of 100 Hz. Corresponding gate signals of the other two phases, e.g., the phase b and the phase c, have similar waveforms except for a phase shift of 120° and 240°, respectively.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. An apparatus for producing a three-phase current, comprising:
   a three-phase output;
   a DC voltage input including a positive terminal, a negative terminal, and a neutral terminal;
   a first switching converter connected between the positive terminal and the neutral terminal, wherein the first switching converter is configured to produce a positive current following a path of a highest phase of a sinusoidal three-phase signal at a given time and to supply the produced positive current to a first switching converter output;
   a second switching converter connected between the neutral terminal and the negative terminal, wherein the second switching converter is configured to produce a negative current following a path of a lowest phase of the sinusoidal three-phase signal at the given time and to supply the produced negative current to a second switching converter output;
   a third switching converter including an inverter leg connected between the positive terminal and the negative terminal, and an output having an inductor connected thereto, wherein the third switching converter is configured to produce an intermediate current following a path of a phase of the sinusoidal three-phase signal between the highest and the lowest phase of the sinusoidal three-phase signal at the given time and to supply the produced intermediate current to a third switching converter output;
   a two-level three-phase inverter bridge including three parallel-connected inverter legs between the outputs of the first switching converter and second switching converter, wherein three outputs of the three parallel-connected inverter legs can be connected to phase conductors of the three-phase output; and
   an arrangement of bidirectional switching devices connected between the third switching converter output and each of the phase conductors, wherein the two-level three-phase inverter bridge and the arrangement of bidirectional switching devices form a current distributing means for switching each of the first, second, and third switching converter outputs to any output phase conductor of the three-phase output; and
   control means for controlling the current distributing means to connect the switching converter outputs to each output phase conductor in sequence so that phase currents of the three-phase current are formed in the output phase conductors.

2. The apparatus as claimed in claim 1, wherein the current distributing means are adapted to operate at a lower switching frequency than the corresponding switching converters.

3. The apparatus as claimed in claim 1, wherein the first switching converter is a buck converter.

4. The apparatus as claimed in claim 1, wherein the second switching converter is a buck converter.

5. The apparatus as claimed in claim 1, comprising an EMI filter at the three-phase output of the apparatus.

6. The apparatus as claimed in claim 1, comprising an EMI filter at the three-phase output of the apparatus.

7. A system for generating renewable power, comprising an apparatus as claimed in claim 1.

8. A system for generating renewable power, the arrangement comprising an apparatus as claimed in claim 1.

* * * * *